US009383809B2

United States Patent
Chun et al.

(10) Patent No.: US 9,383,809 B2
(45) Date of Patent: Jul. 5, 2016

(54) SYSTEM AND METHOD FOR REDUCING MEMORY I/O POWER VIA DATA MASKING

(71) Applicant: Qualcomm Incorporated, San Diego, CA (US)

(72) Inventors: Dexter Chun, San Diego, CA (US); Haw-Jing Lo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 373 days.

(21) Appl. No.: 14/079,620

(22) Filed: Nov. 13, 2013

(65) Prior Publication Data

US 2015/0134989 A1     May 14, 2015

(51) Int. Cl.
| | | |
|---|---|---|
| G06F 1/00 | (2006.01) | |
| G06F 1/32 | (2006.01) | |
| G11C 7/10 | (2006.01) | |
| G11C 11/4096 | (2006.01) | |
| G06F 7/76 | (2006.01) | |

(52) U.S. Cl.
CPC ............ *G06F 1/3275* (2013.01); *G11C 7/1009* (2013.01); *G06F 1/32* (2013.01); *G06F 1/3253* (2013.01); *G06F 7/764* (2013.01); *G11C 7/1006* (2013.01); *G11C 7/1057* (2013.01); *G11C 7/1084* (2013.01); *G11C 11/4096* (2013.01)

(58) Field of Classification Search
CPC ............ G11C 7/1006; G11C 11/4096; G11C 7/1009; G06F 7/764; G06F 1/32; G06F 1/3253; G06F 1/3275
See application file for complete search history.

(56) References Cited

U.S. PATENT DOCUMENTS

| | | | |
|---|---|---|---|
| 7,830,726 B2 | 11/2010 | Huang et al. | |
| 8,295,101 B2 | 10/2012 | Kajigaya | |
| 2002/0144074 A1 | 10/2002 | Wu et al. | |
| 2006/0044879 A1 | 3/2006 | Yamaguchi et al. | |
| 2009/0079748 A1 | 3/2009 | Greco et al. | |
| 2009/0196107 A1* | 8/2009 | Ogasawara | G11C 7/1006 365/189.05 |
| 2010/0125858 A1 | 5/2010 | Fry et al. | |
| 2013/0141990 A1* | 6/2013 | Okubo | G11C 7/1009 365/189.05 |
| 2013/0159818 A1 | 6/2013 | O'Connor et al. | |

FOREIGN PATENT DOCUMENTS

JP      2012043485 A      3/2012

OTHER PUBLICATIONS

International Search Report and Written Opinion—PCT/US2014/065356—ISA/EPO—Feb. 18, 2015—Ten Pages.

* cited by examiner

*Primary Examiner* — Xuxing Chen
(74) *Attorney, Agent, or Firm* — Smith Tempel

(57) ABSTRACT

Systems and methods are disclosed for reducing memory I/O power. One embodiment is a system comprising a system on chip (SoC), a DRAM memory device, and a data masking power reduction module. The SoC comprises a memory controller. The DRAM memory device is coupled to the memory controller via a plurality of DQ pins. The data masking power reduction module comprises logic configured to drive the DQ pins to a power saving state during a data masking operation.

39 Claims, 13 Drawing Sheets

SYSTEM AND METHOD FOR REDUCING MEMORY I/O POWER VIA DATA MASKING

DESCRIPTION OF THE RELATED ART

Dynamic random access memory (DRAM) is used in various computing devices (e.g., personal computers, laptops, notebooks, video game consoles, portable computing devices, mobile phones, etc.). DRAM is a type of volatile memory that stores each bit of data in a separate capacitor within an integrated circuit. The capacitor can be either charged or discharged. These two states are taken to represent the two values of a bit, conventionally called 0 and 1. Because capacitors leak charge, the information eventually fades unless the capacitor charge is refreshed periodically. Because of this refresh requirement, DRAM is referred to as a dynamic memory as opposed to SRAM and other static memory.

An advantage of DRAM is its structural simplicity—only one transistor and a capacitor are required per bit—which allows DRAM to reach very high densities. However, as DRAM density and speed requirements continue to increase, memory power consumption is becoming a significant problem.

Power within DRAM is generally categorized as core memory array power and non-core power. Core memory array power refers to power for retaining all the data in the bitcells/arrays and managing leakage and refresh operations. Non-core power refers to power for transferring all the data into and out of the memory device(s), sensing amps, and managing peripheral logic, multiplexers, internal busses, buffers, input/output (I/O) drivers, and receivers. Reducing non-core power is a significant problem.

Existing solutions to reduce non-core power have typically involved reducing operating voltages, reducing load capacitances, or temporarily reducing the frequency of operation whenever performance is not required. These solutions, however, fail to address demanding bandwidth intensive use cases. Other solutions have attempted to reduce the data activity factor associated with the memory system. The data activity factor, k, refers to the number of 0-to-1 toggles or transitions in the memory access system over a fixed period. For example, in the following 8-beat sequence over a single wire, 0,1,0,1,0,1,0,1, k=0.5. Attempts at reducing the data activity factor have been proposed for specific types of data, such as, display frame buffers using image compression. This is typically performed at the source (i.e., the display hardware engine). Such solutions, however, are very specialized and limited to this type of display data, which typically accounts for a relatively small percentage of total DRAM usage.

Accordingly, there remains a need in the art for improved systems and methods for conserving memory I/O power in DRAM memory systems.

SUMMARY OF THE DISCLOSURE

Systems and methods are disclosed for reducing memory I/O power. One embodiment is a system comprising a system on chip (SoC), a DRAM memory device, and a data masking power reduction module. The SoC comprises a memory controller. The DRAM memory device is coupled to the memory controller via a plurality of DQ pins. The data masking power reduction module comprises logic configured to drive the DQ pins to a power saving state during a data masking operation.

Another embodiment is a method for reducing memory I/O power. One such method comprises: determining a type of a DRAM memory device coupled to a memory controller via a plurality of DQ pins; based on the type of the DRAM memory device, selecting one of a plurality of DQ pin states for reducing memory I/O power associated with the DRAM memory device during a data masking operation; enabling the data masking operation; and during the data masking operation, driving the DQ pins to the selected DQ pin state.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
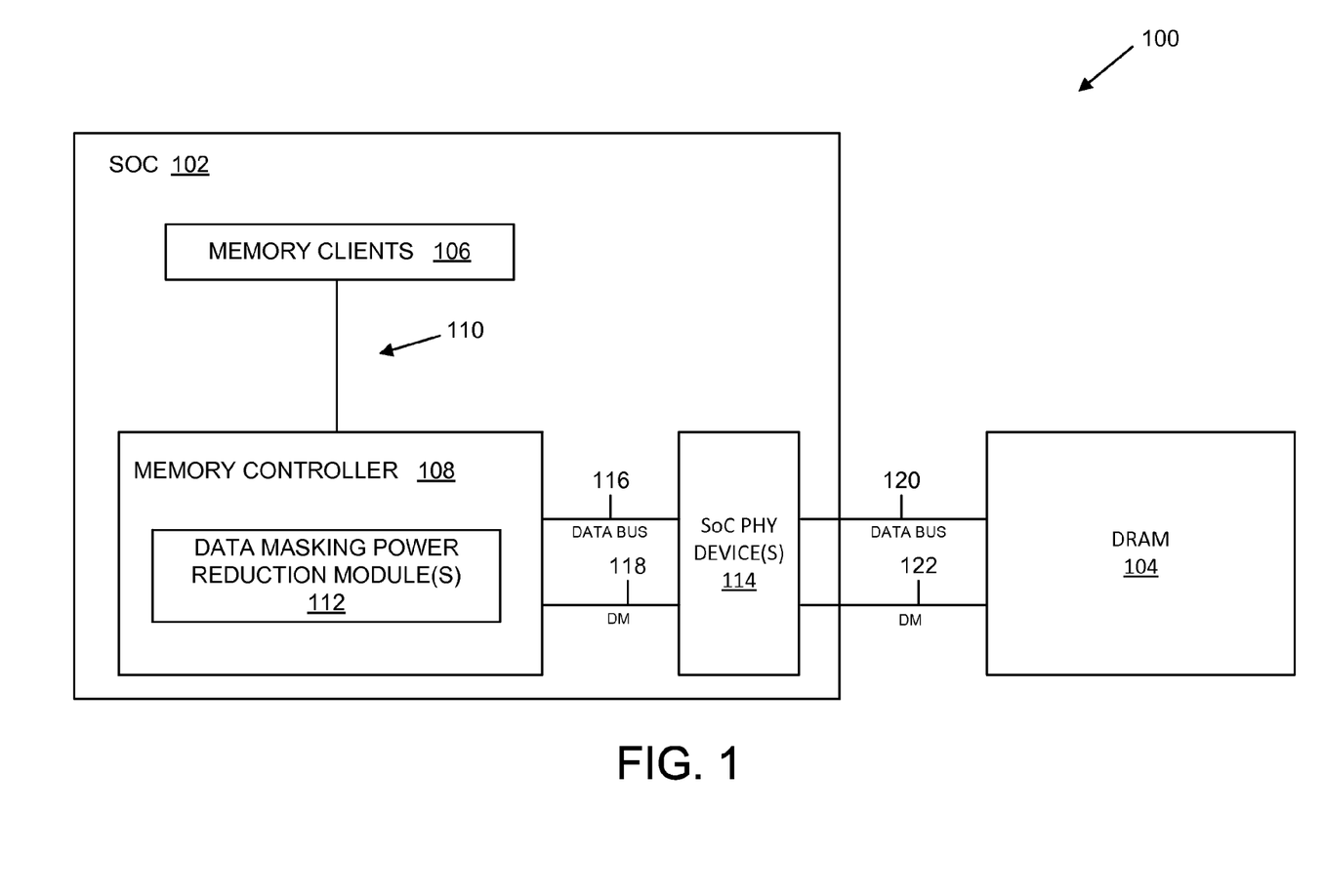
FIG. 1 is a block diagram of an embodiment of a system for reducing memory I/O power via data masking.

FIG. 1 illustrates a system 100 for reducing memory I/O power using a data masking feature. The system 100 may be implemented in any computing device, including a personal computer, a workstation, a server, a portable computing device (PCD), such as a cellular telephone, a portable digital assistant (PDA), a portable game console, a palmtop computer, or a tablet computer. As illustrated in the embodiment of FIG. 1, the system 100 comprises a system on chip (SoC) 102 coupled to a memory system comprising DRAM 104. The SoC 102 comprises various on-chip components, including one or more memory clients 106 that request memory resources from DRAM 104. The memory clients 106 may comprise one or more processing units (e.g., central processing unit (CPU), graphics processing unit (GPU), digital signal processor (DSP), display processor, etc.), a video encoder, or other clients requesting read/write access to DRAM 104. The memory clients 106 are connected to a memory controller 108 via a SoC bus 110. The memory controller 108 controls the flow of data to and from DRAM 104 via SoC physical layer device(s) 114.

As illustrated in FIG. 1, the memory controller 108 and DRAM 104 communicate memory data via a data bus, which comprises interface 116 between the memory controller 108 and the SoC physical layer device(s) 114 and interface 120 between the SoC physical layer device(s) 114 and the DRAM 104. The memory controller 108 is configured to selectively control data masking via data masking (DM) signal(s). The DM signal(s) may be provided to the SoC physical layer device(s) via a connection 118 and to the DRAM 104 via a connection 122. As known in the art, data masking is a built-in feature of memory devices, such as, DRAM 104, to prevent data from being overwritten. As described below in more detail, system 100 enhances the data masking feature to reduce memory I/O power for read and/or write operations associated with DRAM 104.

In an embodiment of the data masking operation, there may be one DM signal per byte of memory data transmitted via data (DQ) pins. For example, one DM pin may control the masking of eight bits of data (i.e., eight DQ pins). The DQ pins send and receive data signals in a bidirectional data bus via interfaces 116 and 120. It should be appreciated that the data bus pins are labeled and referred to as DQ or DQ pins. DM is typically used when the amount of data written to the DRAM 104 is less than the minimum access length (MAL). A DRAM memory transaction is composed of multiple beats across the data bus. The number of beats ("burst length") is fixed and dependent on the DRAM type (e.g., 2 for DDR, 4 for DDR2, 8 for DDR3, etc.). The combination of the number of beats with the width of the data bus defines MAL. For example, a 32-bit wide LPDDR2 has a MAL of 16 bytes (4 beats×32 bits=128 bits=16 bytes).

As further illustrated in FIG. 1, the memory controller 108 comprises data masking power reduction module(s) 112, which are configured to selectively use the data masking feature to reduce memory I/O power. The data masking power reduction module(s) 112 may reduce a data activity factor, k, of the data input to DRAM 104. Power within DRAM may be categorized as core memory array power and non-core power. As known in the art, core memory array power refers to power for retaining all the data in the core memory array and managing leakage and refresh operations. Non-core power refers to power for transferring all the data into and out of the memory device(s), sensing amps, and managing peripheral logic, multiplexers, internal busses, buffers, input/output (I/O) drivers, and receivers. The data masking power reduction module(s) 112 reduce I/O memory power (P), which can be expressed as a sum of dynamic power (D) and static power (S).

Dynamic or non-core power in DRAM 104 may be represented by Equation 1:

$$\text{Dynamic Power}=kCV^2 f*\text{density}, \qquad \text{Equation 1}$$

wherein:
k=data activity factor
C=load capacitance
V=voltage
f=frequency or toggling rate
density=total capacity in gigabytes (GB)

The data activity factor, k, may be defined as a number of 0-to-1 toggles or transitions over a fixed period. For example, in a 1-bit 8-beat sequence, 01010101, k=0.5. The smallest access to the DRAM memory system 104 is referred to as one DRAM minimum access length (MAL) transaction. For a 32-bit parallel LPDDR3 DRAM bus, MAL=32 bits*8 beats=256 bits=32 bytes (eight beats, 32-bits wide). MAL transactions may occur continuously, back-to-back.

Because density and frequency demands are increasing, reducing non-core power requires: reducing load capacitance, reducing voltage, minimizing k for each bit from beat to beat, or minimizing k for each bit from MAL to MAL. Existing methods to reduce non-core power have generally involved reducing the operating voltages, reducing the load capacitances, or temporarily reducing the frequency of operation whenever performance is not required (which fails to address demanding bandwidth intensive use cases). Attempts at reducing the data activity factor, k, have been proposed for specific types of data, such as, display frame buffers using image compression. However, this is typically performed at the source (e.g., the display hardware engine). Such solutions, however, are very specialized and limited to this type of display data, which typically accounts for a relatively small percentage of total DRAM usage.

As described below in more detail, data masking power reduction module(s) 112 reduce memory I/O power by reducing the data activity factor, k, and static power (S) through the use and modification of the data masking (DM) feature. In an embodiment, data masking power reduction module(s) 112 may reduce static power by reducing the amount of time DQ pin termination is consuming power during the data masking operation. In another embodiment, the data activity factor, k, may be reduced by selectively controlling the data masking operation to reduce the number of 0-to-1 toggles over the data bus while the DM signal is enabled.

Figure 2:
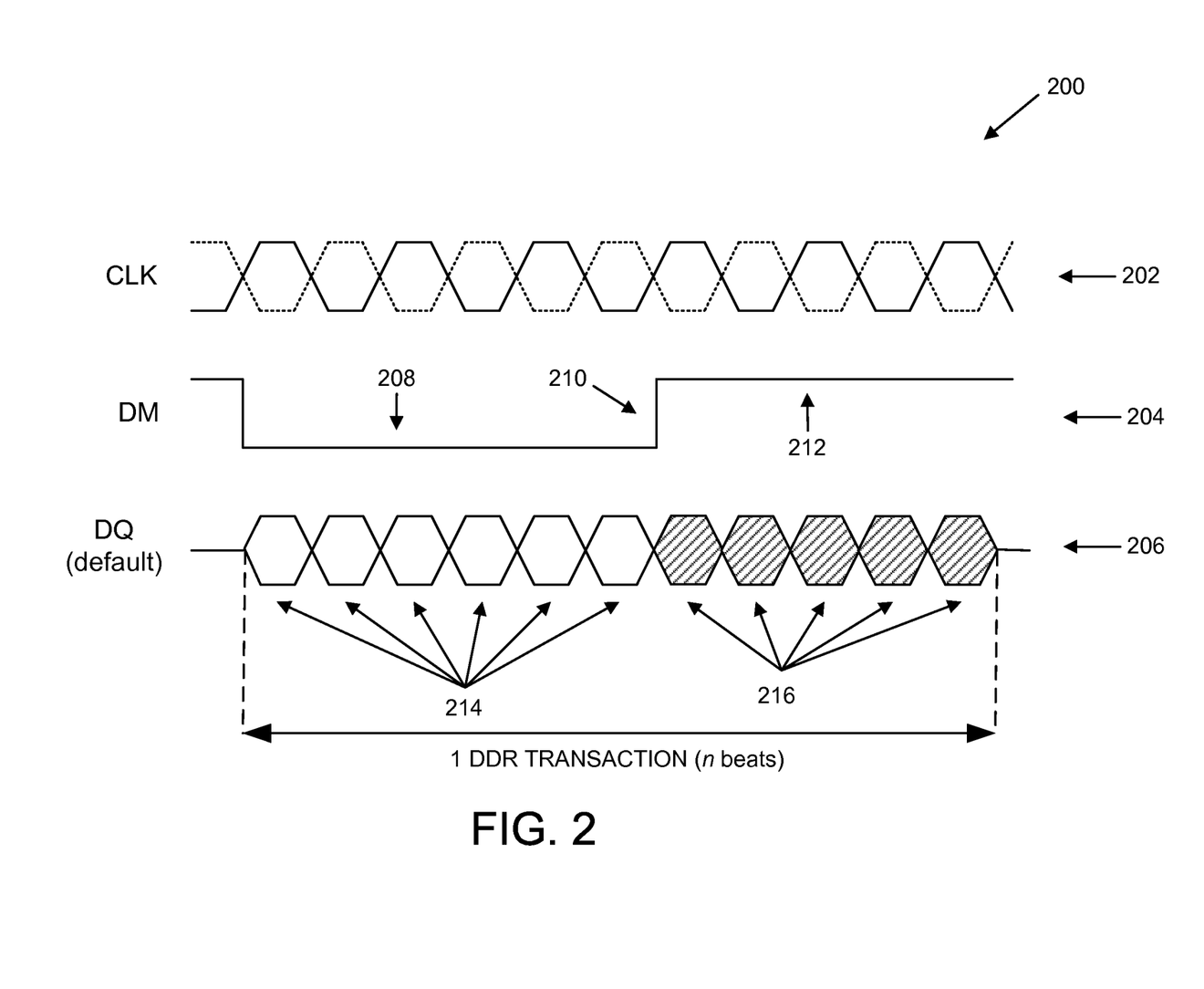
FIG. 2 is a timing diagram illustrating an embodiment of a default data masking operation.

FIG. 2 is a timing diagram illustrating a conventional data masking operation, which the system 100 may employ as a default state 200. FIG. 2 illustrates the relative timing of a synchronization clock signal 202, a DM signal 204 for controlling the data masking operation, and a DQ signal 206 responsive to the DM signal 204. Signals 202, 204, and 206 are illustrated for a DDR transaction comprising the appropriate number of beats (n beats) for a MAL transaction. The clock signal may comprise, for example, a voltage that oscillates between a high and a low state to synchronize the signals. The clock signal 202 may comprise a square wave with a 50% duty cycle with a fixed, constant frequency. In an embodiment, the clock signal 202 comprises a frequency of 1 ns with a data burst of 0.5 ns, although it should be appreciated that the frequency may be varied as desired. The low state may comprise a voltage level of, for example, zero volts, and the high state may comprise a voltage level in the range of, for example, 1.2V-1.5V. It should be appreciated that the high and low states may have alternative voltages and ranges as desired. The DM signal 204 and the DQ signal 206 use the clock signal 202 for synchronization. It should be appreciated that the DM signal 204 and the DQ signal 206 may become active at either the rising edge or the falling edge of the clock signal 202 (or both in the case of double data rate). The DM signal 204 and the DQ signal 206 may swing between appropriate voltage levels. For example, in an embodiment, the DQ signal 206 may swing between a low voltage of zero volts and a high voltage of approximately 1.2V-1.5V. In a differential case, the DQ signal 206 may swing around approximately 200 mV. One of ordinary skill in the art will appreciate that the voltage and time ranges of the clock signal 202, the DM signal 204, and the DQ signal 206 illustrated in FIGS. 2-6 and 9 may be varied as desired.

The memory controller 108 activates and deactivates the data masking operation using the DM signal 204. As illustrated in FIG. 2, when the DM signal 204 is in a low state 208, the data masking operation is inactive, and the corresponding beats 214 are considered valid memory data. The data masking operation is activated by changing the DM signal 204 to a high state 212, as illustrated by the signal transition 210. In the default state 200 illustrated in FIG. 2, when the DM signal 204 is in the high state 212, the corresponding beats 216 comprise a "don't care" (X) state. In the X state, the DQ pins may continue to toggle and consume memory I/O power, but the data may be ignored by DRAM 104.

Instead of leaving the DQ pin in the X state (as in the default state 200), data masking power reduction module(s) 112 may be configured to drive the DQ pin to one of a plurality of power saving states that reduce memory I/O power consumption. In an embodiment, the power saving states may be selected based on the type of DRAM 104 in system 100 and the type of DQ pin termination scheme employed by DRAM 104. Various examples of DQ pin termination schemes (FIGS. 7a-7e) and matching power saving states are described below in connection with FIGS. 3-7.

Figure 3:
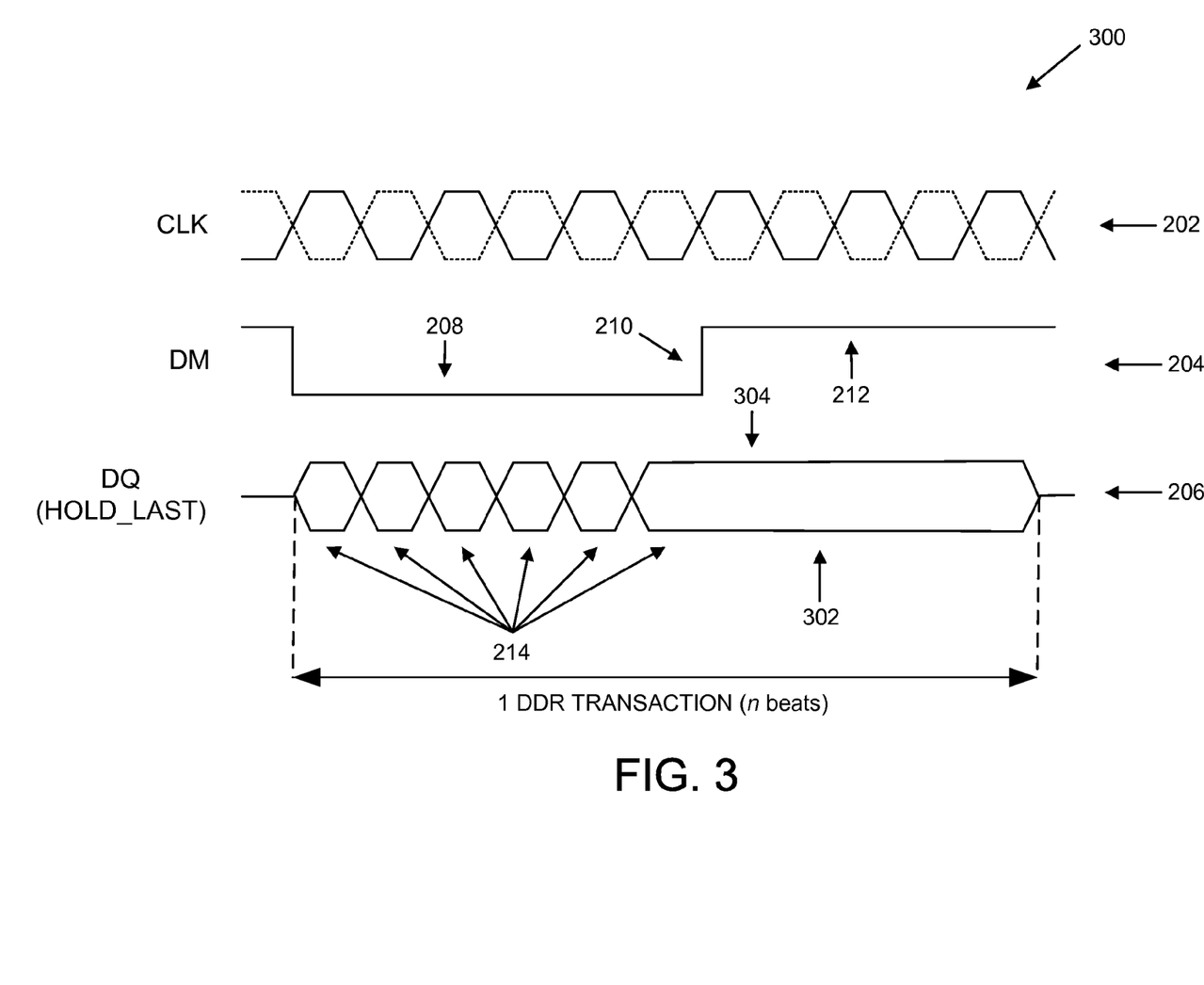
FIG. 3 is a timing diagram illustrating an embodiment of a hold last state for reducing memory I/O power during data masking.
Figure 7A:
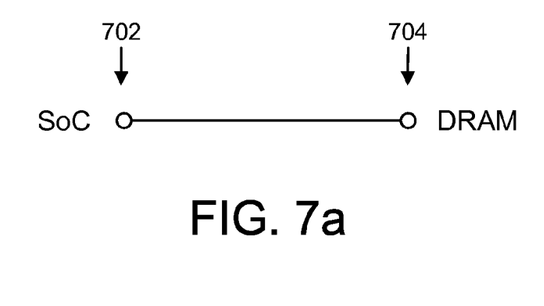
FIGS. 7a-7e illustrate various embodiments of DQ pin termination schemes for driving DQ pins during data masking.
Figure 7B:
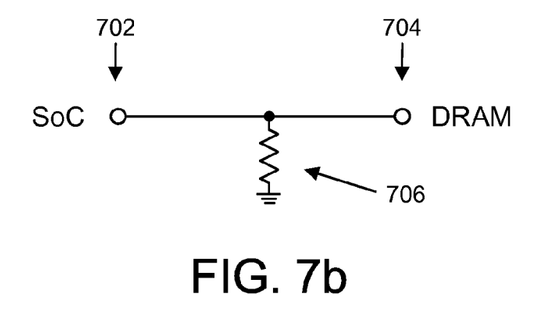
Figure 7C:
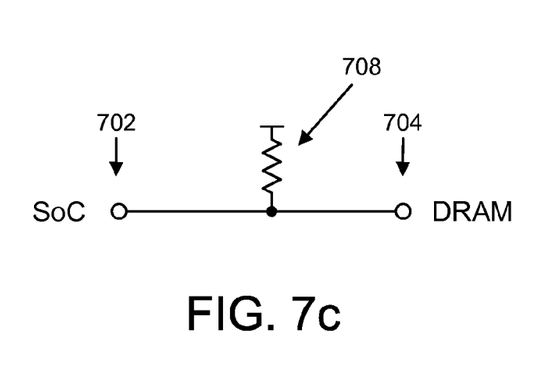
Figure 7D:
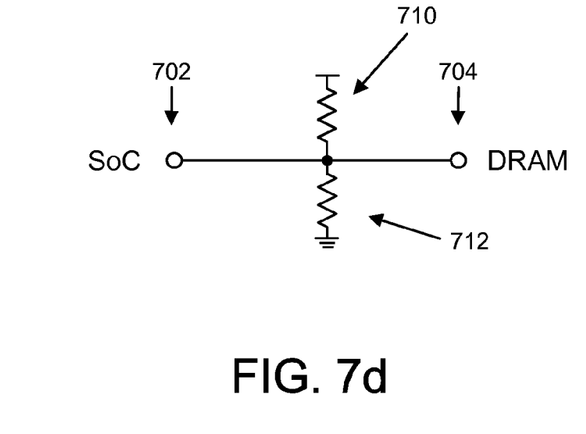
Figure 7E:
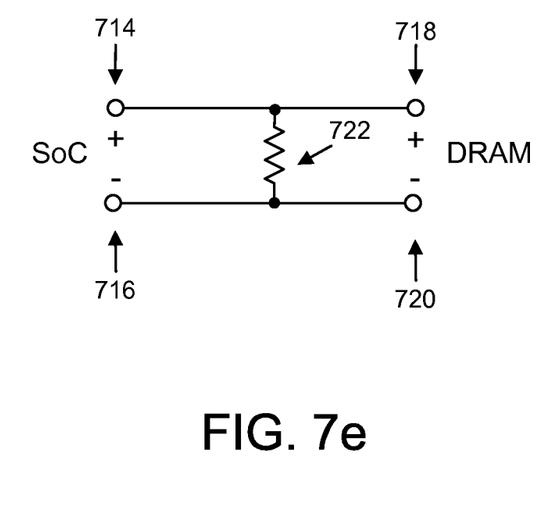

One example of a power saving state is a hold last state. FIG. 3 illustrates the timing diagram of signals 202, 204, and 206 for a hold last state 300 instead of the default state 200 (FIG. 2). In the hold last state 300, the last value on the DQ pin prior to transition 210 is held during the data masking operation. As illustrated in FIG. 3, if the last value was a high state, the DQ pin is held at high state 304 while the DM signal 204 is active. If the last value was a low state, the DQ pin is held at a low state 302. It should be appreciated that the hold last state 300 may reduce memory I/O power consumption because there would not be any further toggles. It should be further appreciated that the hold last state may be implemented for any DRAM type. It may be particularly desirable to apply the hold last state 300 for DRAM devices that employ unterminated DQ pins (FIG. 7a) or differential terminated DQ pins (FIG. 7e). The unterminated DQ pin scheme illustrated in FIG. 7a comprises a SoC pin 702 and a DRAM pin 704, which are not terminated. As illustrated in FIG. 7e, in the case of differential terminated DQ pins, the positive pins 714 and 718 and the negative pins 716 and 720 may both be driven to the same value (e.g., last positive value) through a resistance 722 connecting the positive and negative pins.

Figure 4:
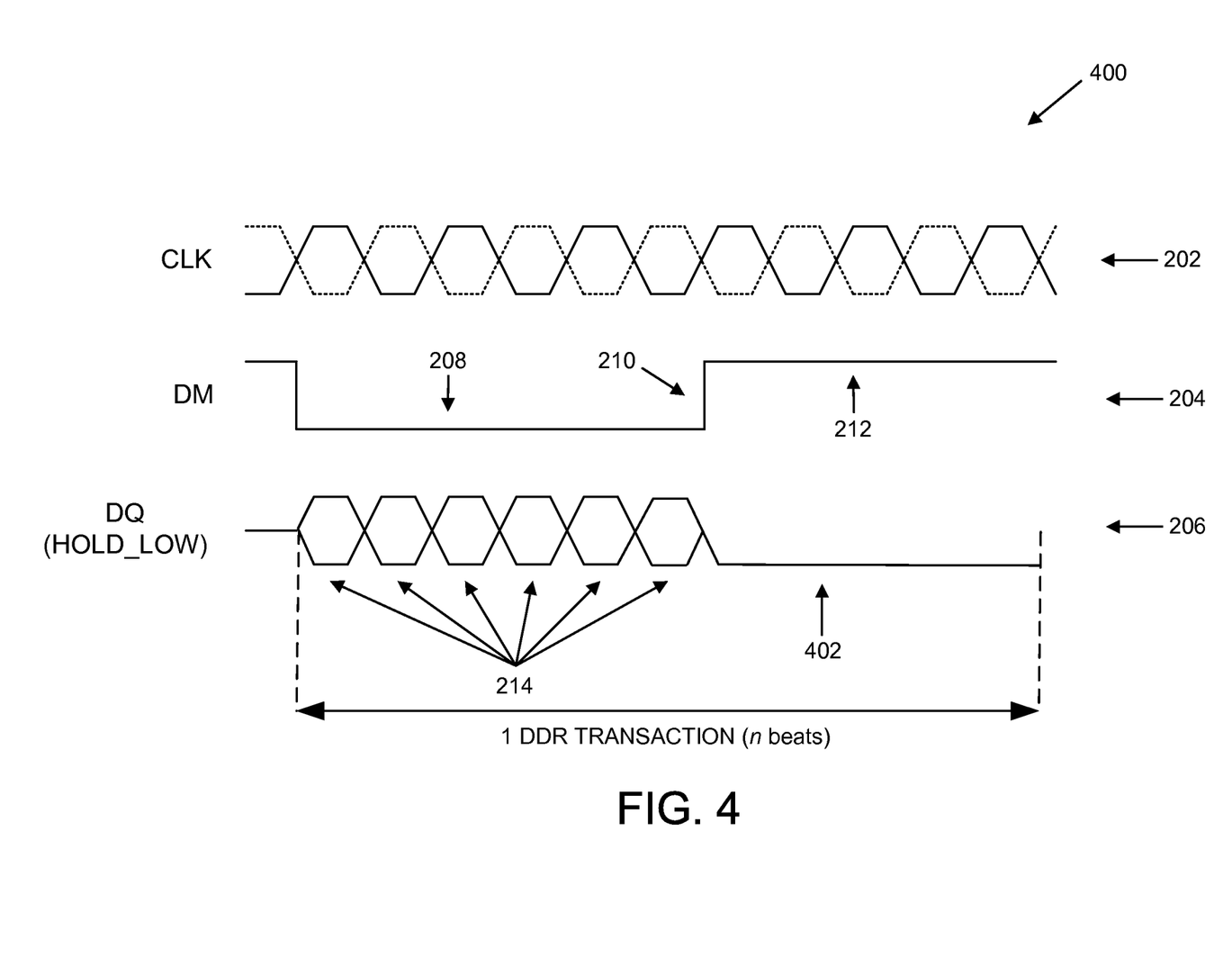
FIG. 4 is a timing diagram illustrating an embodiment of a hold low state for reducing memory I/O power during data masking.

FIG. 4 illustrates a hold low state 400. In the hold low state 300, the DQ pin is driven to a low state 402 while the DM signal 204 is active. The hold low state 300 may conserve static power for memory systems that employ ground referenced signaling (e.g., LPDDR4 type DRAM), as illustrated in FIG. 7b. Referring to FIG. 7b, in an embodiment, the connection between the SoC pin 702 and the DRAM pin 704 may be grounded through a resistance 706.

Figure 5:
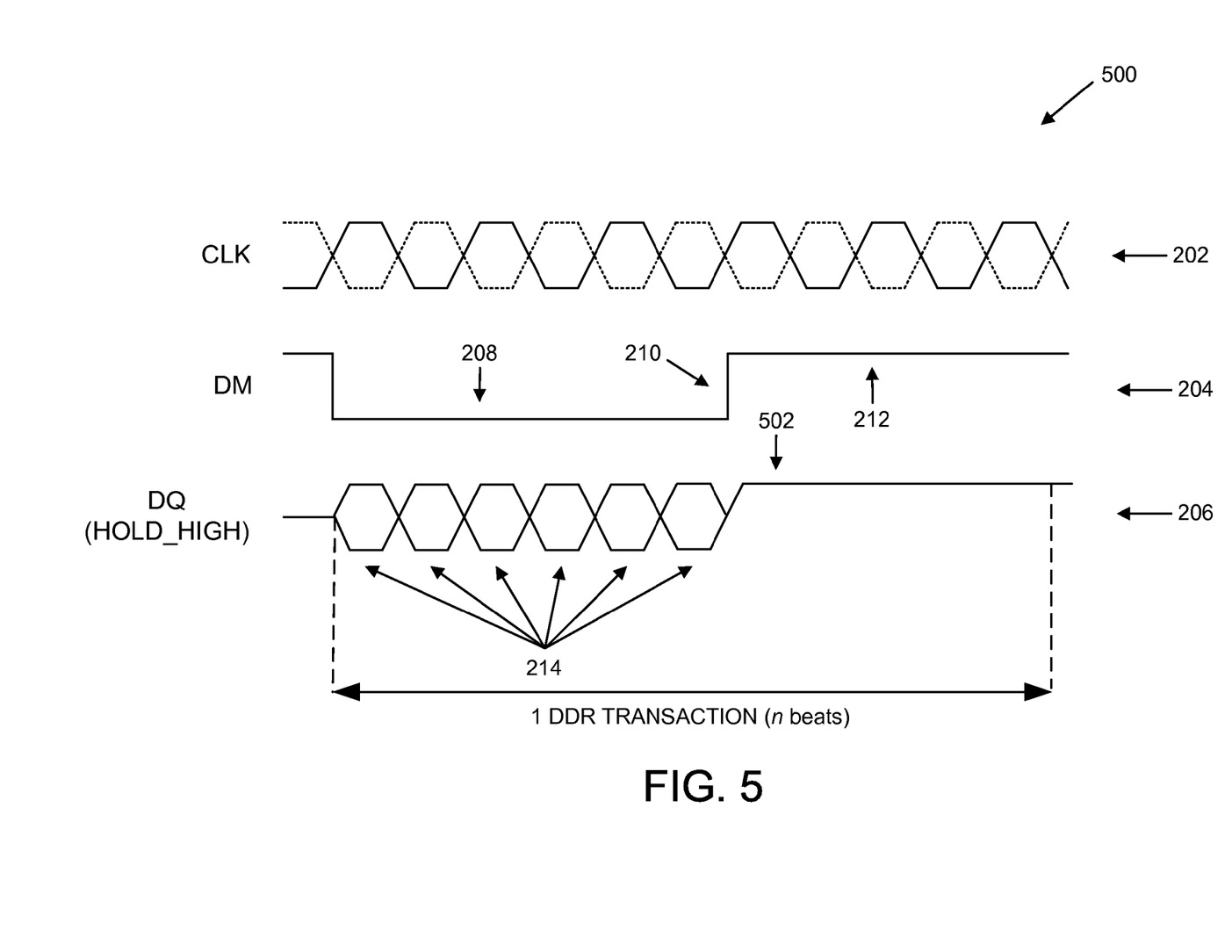
FIG. 5 is a timing diagram illustrating an embodiment of a hold high state for reducing memory I/O power during data masking.

FIG. 5 illustrates a hold high state 500. In the hold high state 500, the DQ pins are driven to a high state 502. The hold high state 500 may save static power for memory systems that employ supply referenced signaling (e.g., PCDDR4), as illustrated in FIG. 7c. In the embodiment of FIG. 7c, the connection between the SoC pin 702 and the DRAM pin 704 may be connected to a power source via a resistance 708.

Figure 6:
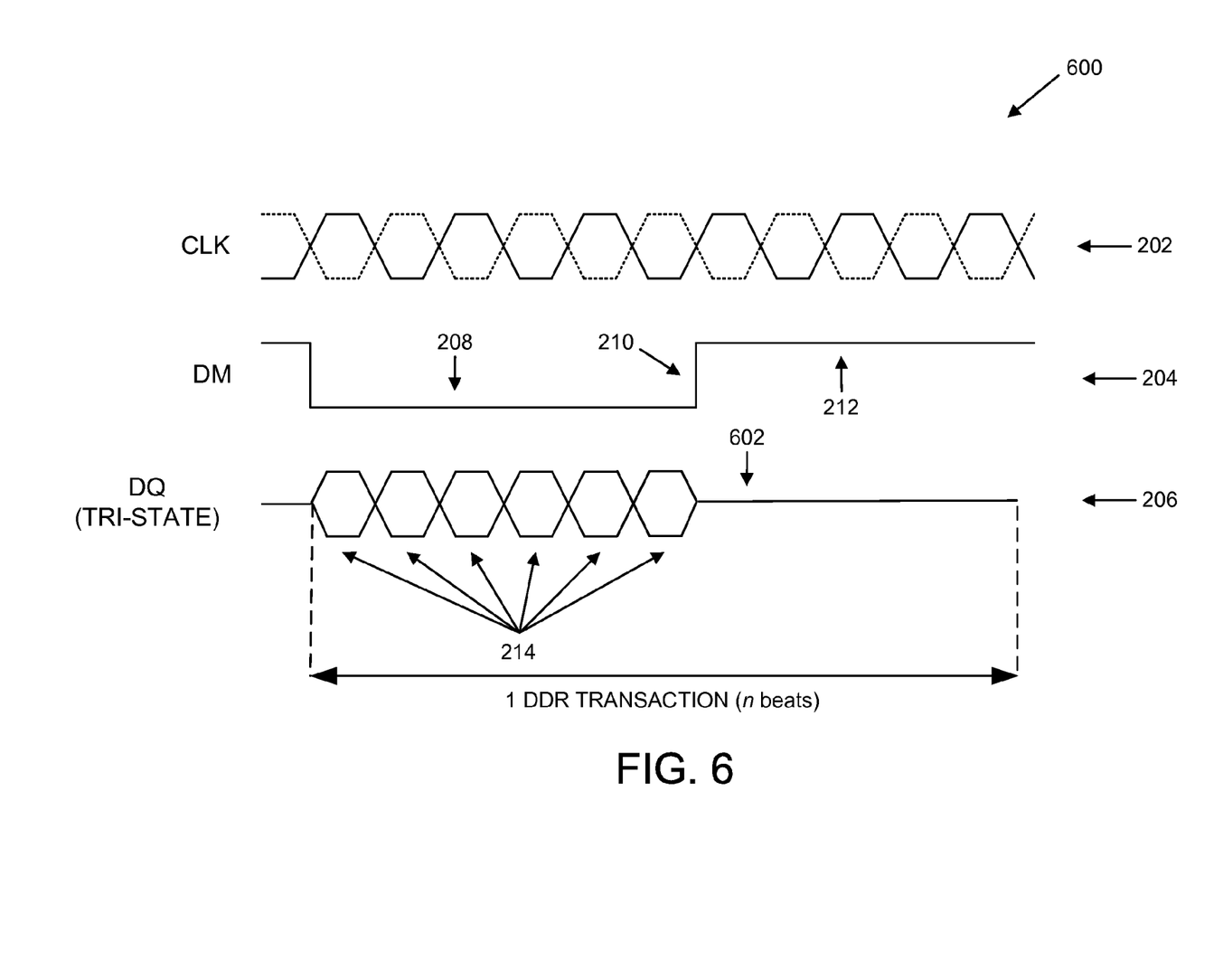
FIG. 6 is a timing diagram illustrating an embodiment of a tri-state state for reducing memory I/O power during data masking.

FIG. 6 illustrates a tri-state 600. In the tri-state 600, the DQ pins are tri-stated or left floating (i.e., not driven). The tri-state 600 may save static power for memory systems with termination resistors 710 and 712 to both Vdd and ground (e.g., PCDDR3), as illustrated in FIG. 7d.

Figure 8:
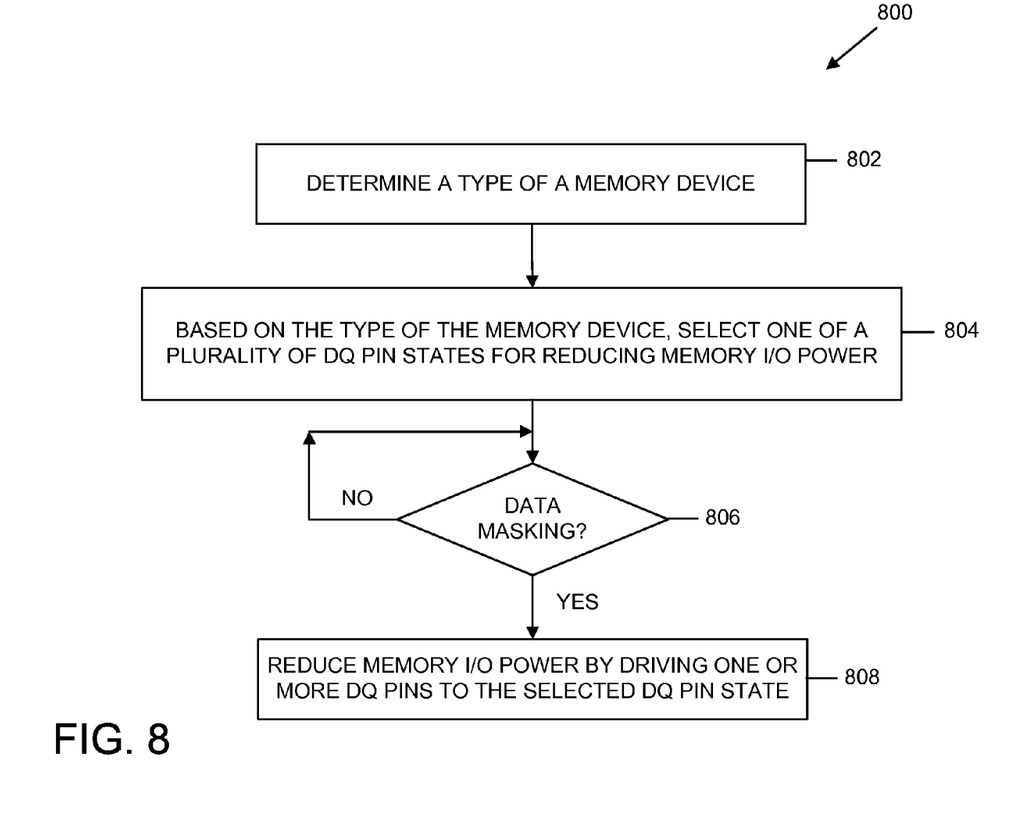
FIG. 8 is a flow chart illustrating an embodiment of a method implemented in the system of FIG. 1 for reducing memory I/O power via data masking.

FIG. 8 is a flowchart 800 illustrating an embodiment of a method 800 implemented by the system 100 for reducing memory I/O power. At block 802, the method 800 determines the type of the DRAM 104 coupled to the memory controller 108 via a plurality of DQ pins. As mentioned above, different types of DRAM 104 may employ different DQ pin terminations (FIGS. 7a-7e). Based on the type of DRAM 104 and/or DQ pin termination, at block 802, a matching power saving state (i.e., hold last state 300, hold low state 400, hold high state 500, tri-state 600) may be selected. When the data masking operation is activated (decision block 806), the DQ pins may be driven to the selected state, as described above, to reduce memory I/O power.

Figure 9:
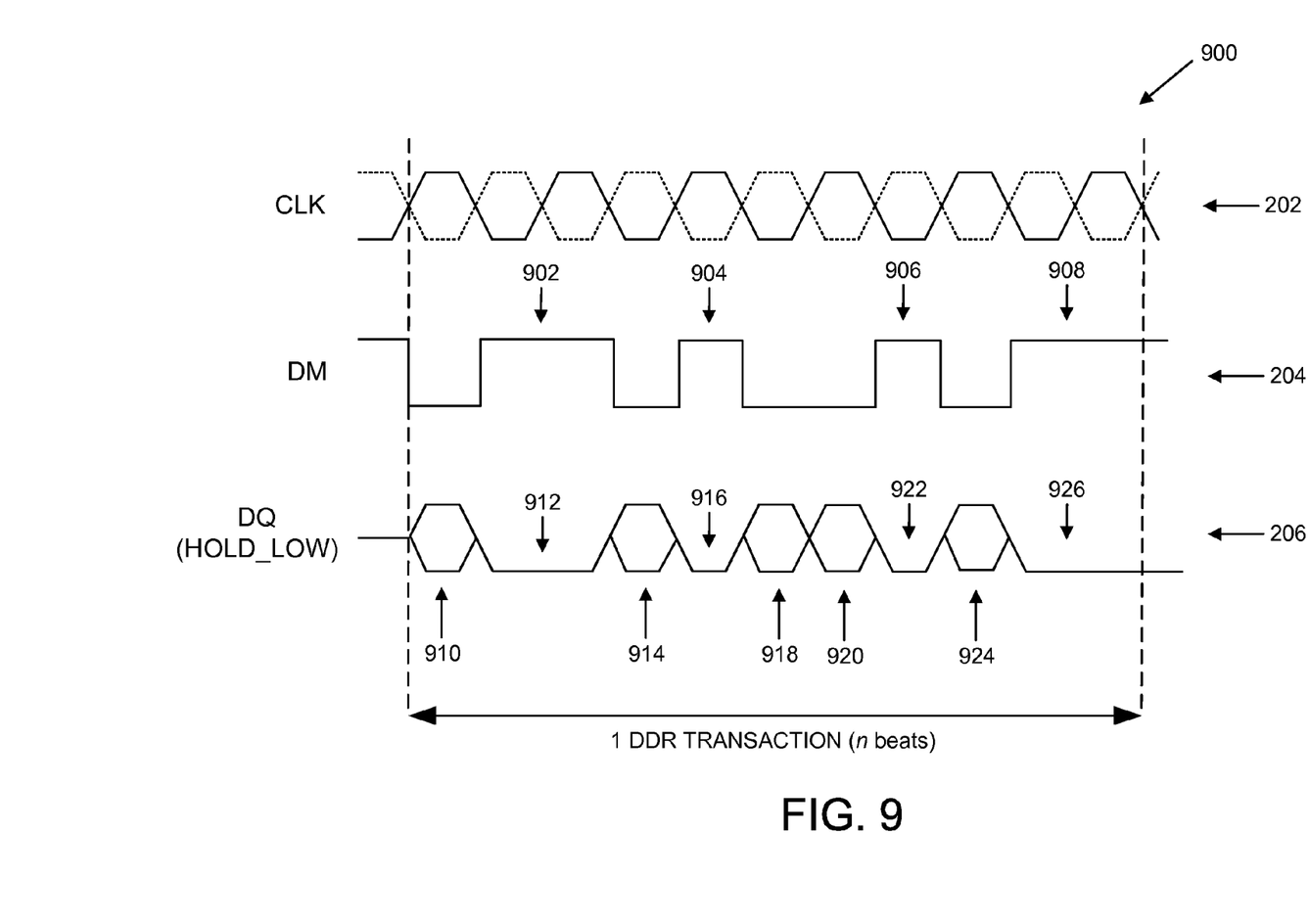
FIG. 9 is a timing diagram illustrating an embodiment of a data masking power reduction method implemented during a DDR transaction.

It should be appreciated that data masking power reduction may be performed at any time during the DDR transaction. In the embodiments described above in connection with FIGS. 2-6, the data masking operation is performed at the end of the DDR transaction. In other embodiments, the data masking operation may be performed at the beginning of the DDR transaction. FIG. 9 illustrates another embodiment in which the data masking operation may be selectively activated mid-transaction for one or more beats. As illustrated in the example of FIG. 9, the data masking operation is activated multiple times during the DDR transaction (high states 902, 904, 906, and 908). High states 902 and 908 are active for two beats, while high states 904 and 906 are active for a single beat. During the DM signal 204 high states 902, 904, 906, and 908, the DQ signal 206 is driven to low states 912, 916, 922, and 926, respectively, to reduce memory I/O power. When the DM signal 204 is in the low states, the data masking operation is inactive, and the corresponding beats 910, 914, 918, 920, and 924 are considered valid memory data. It should be appreciated that the DM signal 204 may be enabled any number of times for any number of beats during the DDR transaction to optimize memory I/O power reduction.

Figure 10:
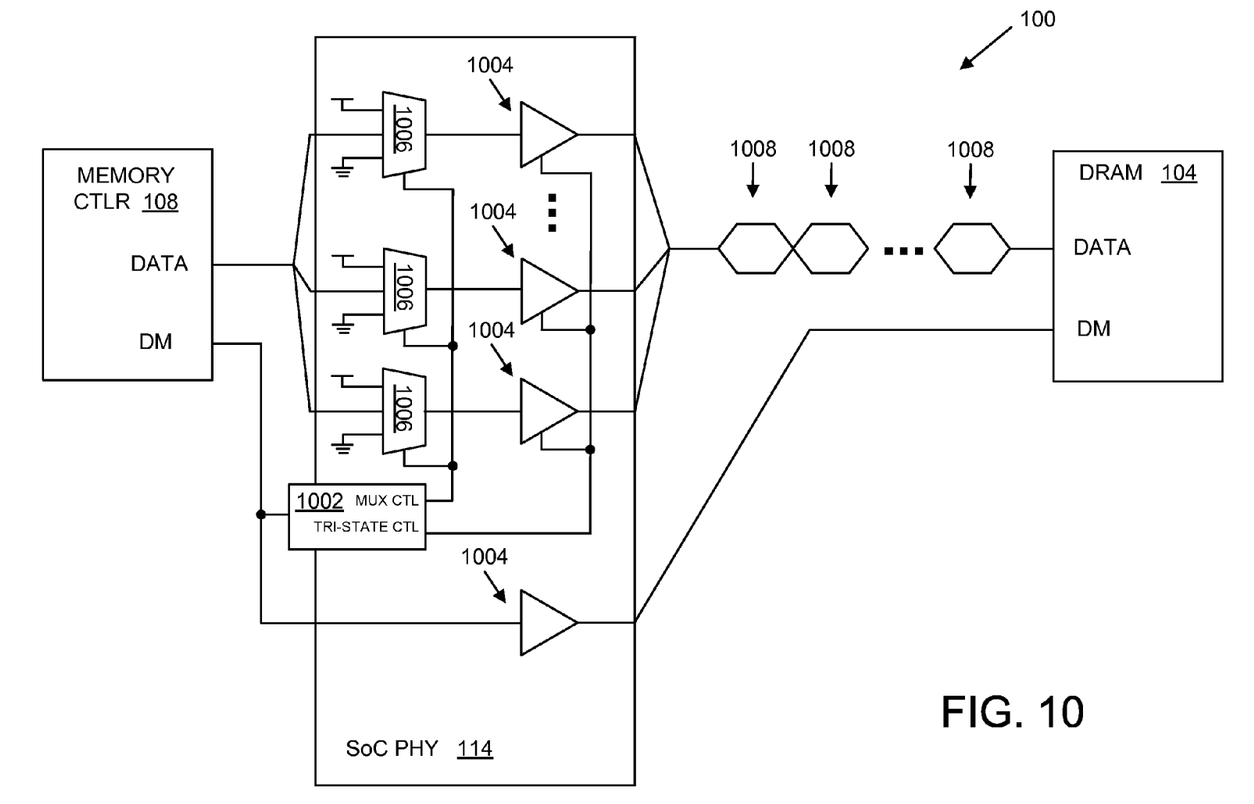
FIG. 10 is block diagram illustrating an embodiment of a data masking power reduction method applied to a memory read operation.

The data masking power reduction schemes described above may be applied during a read operation or a write operation. FIG. 10 illustrates an embodiment of system 100 for a write operation. For a write operation, the SoC physical layer device 114 may comprise a line driver 1004 and a multiplexer 1006 for each DQ pin. Each multiplexer 1006 has an input for receiving data from the memory controller 108 and another input connected to I/O logic 1002 for receiving a multiplexer control signal (MUX CTL). I/O logic 1002 is configured to determine which multiplexer input to pass to the I/O based on the DM signal 204 and DRAM type.

As further illustrated in FIG. 10, the output from a multiplexer 1006 is provided as input to the corresponding line driver 1004. Each line driver 1004 also receives a tri-state control signal from I/O logic 1002. I/O logic 1002 controls the tri-state of the I/Os based on the tri-state control signal. For example if the DRAM type is LPDDR4, I/O logic 1002 may drive the I/Os to ground when DM is asserted. A single DDR channel may have multiple instances of the SoC physical layer device 114 and an appropriately configured memory controller 108.

Figure 11:
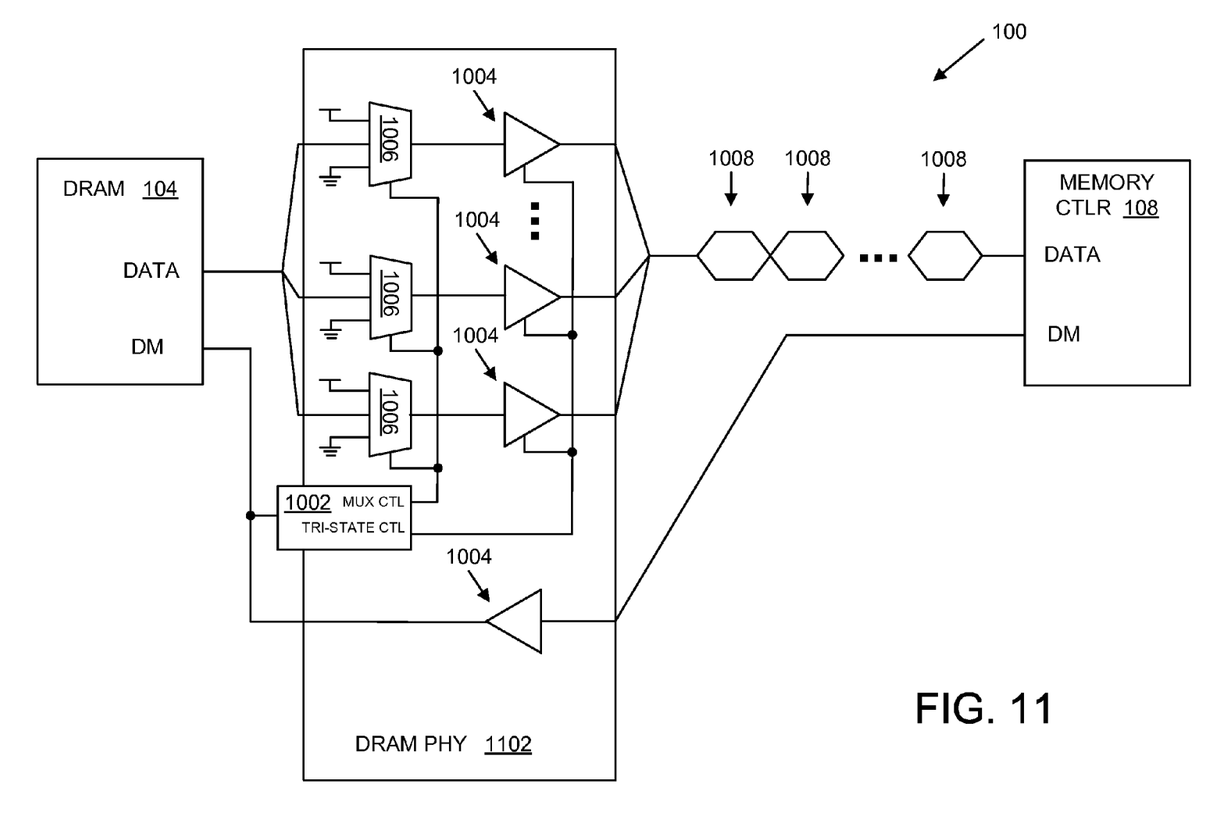
FIG. 11 is block diagram illustrating an embodiment of a data masking power reduction method applied to a memory write operation.

FIG. 11 illustrates another embodiment of system 100 for a read operation. The read implementation is similar to a write implementation with the line drivers 1004, multiplexers 1006, and the I/O logic 1002 being implemented at the DRAM physical layer 1102. It should be appreciated that, in alternative embodiments, the multiplexers 1006 and the I/O logic 1002 may be implemented in other components of system 100 than the physical layer devices 114 and 1102. As further illustrated in FIG. 11, the DRAM 104 may be configured to support a data masking operation for read operations. The DRAM 104 may comprise data masking power reduction module(s) 112 (FIG. 1), as described above.

Figure 12:
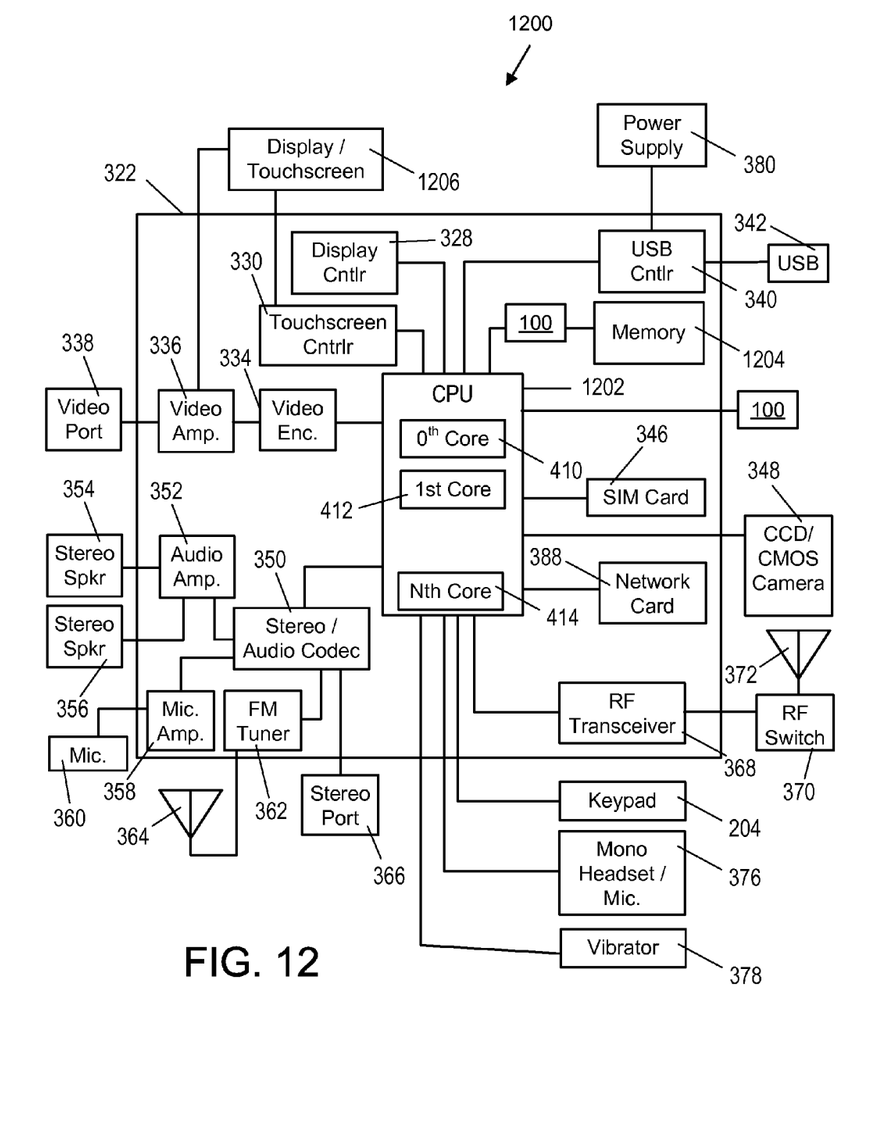
FIG. 12 is a block diagram of an embodiment of a portable computer device comprising the system of FIG. 1.

As mentioned above, the system 100 may be incorporated into any desirable computing system. FIG. 12 illustrates the system 100 incorporated in an exemplary portable computing device (PCD) 1200. It will be readily appreciated that certain components of the system 100 are included on the SoC 322 (FIG. 12) while other components (e.g., the DRAM 104) are external components coupled to the SoC 322. The SoC 322 may include a multicore CPU 402A. The multicore CPU 1202 may include a zeroth core 410, a first core 412, and an Nth core 414. One of the cores may comprise, for example, a graphics processing unit (GPU) with one or more of the others comprising the CPU.

A display controller 328 and a touch screen controller 330 may be coupled to the CPU 1202. In turn, the touch screen display 108 external to the on-chip system 322 may be coupled to the display controller 1206 and the touch screen controller 330.

FIG. 12 further shows that a video encoder 334, e.g., a phase alternating line (PAL) encoder, a sequential color a memoire (SECAM) encoder, or a national television system(s) committee (NTSC) encoder, is coupled to the multicore CPU 1202. Further, a video amplifier 336 is coupled to the video encoder 334 and the touch screen display 1206. Also, a video port 338 is coupled to the video amplifier 336. As shown in FIG. 12, a universal serial bus (USB) controller 340 is coupled to the multicore CPU 1202. Also, a USB port 342 is coupled to the USB controller 340. Memory 1204 and a subscriber identity module (SIM) card 346 may also be coupled to the multicore CPU 1202. Memory 1204 may reside on the SoC 322 or be coupled to the SoC 322 (as illustrated in FIG. 1). The memory 1204 may comprise DRAM memory system 104 (FIG. 1) as described above.

Further, as shown in FIG. 12, a digital camera 348 may be coupled to the multicore CPU 1202. In an exemplary aspect, the digital camera 348 is a charge-coupled device (CCD) camera or a complementary metal-oxide semiconductor (CMOS) camera.

As further illustrated in FIG. 12, a stereo audio coder-decoder (CODEC) 350 may be coupled to the multicore CPU 1202. Moreover, an audio amplifier 352 may coupled to the stereo audio CODEC 350. In an exemplary aspect, a first stereo speaker 354 and a second stereo speaker 356 are coupled to the audio amplifier 352. FIG. 12 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 12 further illustrates that a radio frequency (RF) transceiver 368 may be coupled to the multicore CPU 402A. An RF switch 370 may be coupled to the RF transceiver 368 and an RF antenna 372. As shown in FIG. 12, a keypad 204 may be coupled to the multicore CPU 1202. Also, a mono headset with a microphone 376 may be coupled to the multicore CPU 1202. Further, a vibrator device 378 may be coupled to the multicore CPU 1202.

FIG. 12 also shows that a power supply 380 may be coupled to the on-chip system 322. In a particular aspect, the power supply 380 is a direct current (DC) power supply that provides power to the various components of the PCD 1200 that require power. Further, in a particular aspect, the power supply is a rechargeable DC battery or a DC power supply that is derived from an alternating current (AC) to DC transformer that is connected to an AC power source.

FIG. 12 further indicates that the PCD 1200 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 12, the touch screen display 1206, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for reducing memory input/output (I/O) power, the method comprising:
   determining a type of a dynamic random access memory (DRAM) memory device coupled to a memory controller via a plurality of data bus (DQ) pins;
   based on the type of the DRAM memory device, selecting one of a plurality of DQ pin states for reducing memory I/O power associated with the DRAM memory device during a data masking operation;
   enabling the data masking operation; and
   during the data masking operation, driving the DQ pins to the selected DQ pin state.

2. The method of claim 1, wherein the data masking operation occurs during a memory write operation.

3. The method of claim 1, wherein the data masking operation occurs during a memory read operation.

4. The method of claim 1, wherein the plurality of DQ pin states comprise one or more of a hold last state, a hold low state, a hold high state, and a tri-state.

5. The method of claim 4, wherein the selecting the DQ pin state is based on a DQ pin termination scheme associated with the type of the DRAM memory device.

6. The method of claim 1, wherein the DRAM memory device comprises a double data rate (DDR) DRAM memory device.

7. The method of claim 6, wherein the data masking operation occurs during a DDR transaction.

8. The method of claim 7, wherein the data masking operation is enabled for a single beat of the DDR transaction.

9. The method of claim 7, wherein the data masking operation is enabled at one of a beginning or an end of the DDR transaction.

10. The method of claim 1, wherein the memory controller resides on a system on chip (SoC) coupled to the DRAM memory device.

11. A system for reducing memory input/output (I/O) power comprising:
    means for determining a type of a dynamic random access memory (DRAM) memory device coupled to a memory controller via a plurality of data bus (DQ) pins;
    means for selecting, based on the type of the DRAM memory device, one of a plurality of DQ pin states for reducing memory I/O power associated with the DRAM memory device during a data masking operation;
    means for enabling the data masking operation; and
    means for driving the DQ pins to the selected DQ pin state during the data masking operation.

12. The system of claim 11, wherein the data masking operation occurs during a memory write operation.

13. The system of claim 11, wherein the data masking operation occurs during a memory read operation.

14. The system of claim 11, wherein the plurality of DQ pin states comprise one or more of a hold last state, a hold low state, a hold high state, and a tri-state.

15. The system of claim 14, wherein the means for selecting the DQ pin state is based on a DQ pin termination scheme associated with the type of the DRAM memory device.

16. The system of claim 11, wherein the DRAM memory device comprises a double data rate (DDR) DRAM memory device.

17. The system of claim 16, wherein the data masking operation occurs during a DDR transaction.

18. The system of claim 17, wherein the data masking operation is enabled for a single beat of the DDR transaction.

19. The system of claim 17, wherein the data masking operation is enabled at one of a beginning or an end of the DDR transaction.

20. The system of claim 11, wherein the memory controller resides on a system on chip (SoC) coupled to the DRAM memory device.

21. A computer program for reducing memory input/output (I/O) power, the computer program embodied in a non-transitory computer readable medium and executable by a processor, the computer program comprising:
 logic configured to determine a type of a dynamic random access memory (DRAM) memory device coupled to a memory controller via a plurality of data bus (DQ) pins;
 logic configured to select, based on the type of the DRAM memory device, one of a plurality of DQ pin states for reducing memory I/O power associated with the DRAM memory device during a data masking operation;
 logic configured to enable the data masking operation; and
 logic configured to drive the DQ pins to the selected DQ pin state during the data masking operation.

22. The computer program of claim 21, wherein the data masking operation occurs during a memory write operation.

23. The computer program of claim 21, wherein the data masking operation occurs during a memory read operation.

24. The computer program of claim 21, wherein the plurality of DQ pin states comprise one or more of a hold last state, a hold low state, a hold high state, and a tri-state.

25. The computer program of claim 24, wherein the logic configured to select the DQ pin state is based on a DQ pin termination scheme associated with the type of the DRAM memory device.

26. The computer program of claim 21, wherein the DRAM memory device comprises a double data rate (DDR) DRAM memory device.

27. The computer program of claim 26, wherein the data masking operation occurs during a DDR transaction.

28. The computer program of claim 27, wherein the data masking operation is enabled for a single beat of the DDR transaction.

29. The computer program of claim 27, wherein the data masking operation is enabled at one of a beginning or an end of the DDR transaction.

30. The computer program of claim 21, wherein the memory controller resides on a system on chip (SoC) coupled to the DRAM memory device.

31. A system for reducing memory input/output (I/O) power, the system comprising:
 a system on chip (SoC) comprising a memory controller;
 a dynamic random access memory (DRAM) memory device coupled to the memory controller via a plurality of data bus (DQ) pins; and
 a data masking power reduction module comprising logic configured to drive the DQ pins to a power saving state during a data masking operation;
 wherein the data masking power reduction module further comprises:
  logic configured to determine a type of the DRAM memory device; and
  logic configured to select the power saving state based on the type of the DRAM memory device.

32. The system of claim 31, wherein the data masking operation occurs during a memory write operation.

33. The system of claim 31, wherein the data masking operation occurs during a memory read operation.

34. The system of claim 31, wherein the power saving state comprises one of a hold last state, a hold low state, a hold high state, and a tri-state.

35. The system of claim 31, wherein the power saving state is based on a DQ pin termination scheme associated with the DRAM memory device.

36. The system of claim 31, wherein the DRAM memory device comprises a double data rate (DDR) DRAM memory device.

37. The system of claim 36, wherein the data masking operation occurs during a DDR transaction.

38. The system of claim 37, wherein the data masking operation is enabled for a single beat of the DDR transaction.

39. The system of claim 37, wherein the data masking operation is enabled at one of a beginning or an end of the DDR transaction.

* * * * *